(12) United States Patent
Yamamoto et al.

(10) Patent No.: US 8,473,248 B2
(45) Date of Patent: *Jun. 25, 2013

(54) TEST APPARATUS AND TEST METHOD

(75) Inventors: Kazuhiro Yamamoto, Tokyo (JP);
Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 192 days.

This patent is subject to a terminal disclaimer.

(21) Appl. No.: 12/994,429

(22) PCT Filed: Sep. 18, 2009

(86) PCT No.: PCT/JP2009/004763
§ 371 (c)(1),
(2), (4) Date: Nov. 23, 2010

(87) PCT Pub. No.: WO2011/033589
PCT Pub. Date: Mar. 24, 2011

(65) Prior Publication Data
US 2011/0172957 A1    Jul. 14, 2011

(51) Int. Cl.
*G01R 31/00* (2006.01)

(52) U.S. Cl.
USPC ............... 702/176; 702/69; 702/79; 702/126; 375/224; 375/226; 324/76.77

(58) Field of Classification Search
USPC .............. 702/176, 126, 69, 79; 375/224, 226, 375/373; 324/76.77
See application file for complete search history.

(56) References Cited

U.S. PATENT DOCUMENTS 6,598,004 B1 * 7/2003 Ishida et al. .................... 702/69
2007/0091991 A1 * 4/2007 Sartschev et al. ............. 375/224

FOREIGN PATENT DOCUMENTS

| EP | 2133995 A1 | 12/2009 |
|---|---|---|
| JP | 07-280884 A | 10/1995 |
| JP | 2002-107392 A | 4/2002 |
| JP | 2006-329735 A | 12/2006 |
| JP | 2009-14363 A | 1/2009 |
| JP | 2009-509174 A | 3/2009 |
| JP | 2009-098040 A | 5/2009 |
| WO | WO2007/038233 A2 | 4/2007 |
| WO | 2008/114509 A1 | 9/2008 |

OTHER PUBLICATIONS

PCT International Search Report for PCT Application No. PCT/JP2009/004763 mailed on Dec. 22, 2009, with an English-language translation.
PCT Written Opinion for PCT Application No. PCT/JP2009/004763 mailed on Dec. 22, 2009, with an English-language translation.
IPRP/WO for the related App. No. PCT/JP2009/004763 along with English translation issued on Apr. 11, 2012.
Office Action dated Apr. 2, 2013 for related Japanese Patent Application No. 2010-523216 and its English summary provided by the clients.

* cited by examiner

*Primary Examiner* — Jonathan C Teixeira Moffat
*Assistant Examiner* — Hien Vo
(74) *Attorney, Agent, or Firm* — Ladas & Parry LLP

(57) ABSTRACT

A first transform unit transforms clock change point information which indicates the change timing of a clock signal into information with respect to the frequency domain thereof so as to generate first clock change point frequency information. A digital filter performs filtering of the first clock change point frequency information so as to generate second clock change point frequency information. A second transform unit inverse-transforms the second clock change point frequency information into information with respect to the time domain so as to generate second clock change point information. A judgment unit evaluates a DUT based upon difference data between the change timing represented by the data change point information and the change timing represented by the second clock change point information in increments of phases.

4 Claims, 12 Drawing Sheets

US 8,473,248 B2

TEST APPARATUS AND TEST METHOD

CROSS REFERENCE TO RELATED APPLICATIONS

This application is the U.S. National Stage of International Patent Application No. PCT/JP2009/004763 filed on Sep. 18, 2009 and claims priority thereto, the disclosure of which is hereby incorporated by reference in its entirety.

BACKGROUND OF THE INVENTION

1. Field of the Invention

The present invention relates to a test apparatus.

2. Description of the Related Art

As high-speed data transmission methods for data transmission between semiconductor devices, a source synchronous method, a forwarded clock method, a CDR (Clock Data Recovery) method, etc., are known.

With the source synchronous method, in addition to a data signal, a clock signal is transmitted via two transmission lines in synchronization with the data signal. For example, where the transmission rate is 1.6 GHz, an 800 Mhz reference clock and 1.6 Gbps of data, severally assigned to the positive edge and the negative edge of the reference clock, are transmitted. On the receiver side, the data is latched at a a positive edge timing or a negative edge timing of the reference clock. That is to say, the data and the clock signal output from the transmission device correspond to one another in a one-to-one manner.

In contrast, with the forwarded clock method, the data transmission frequency is an integral multiple of (n times) the reference clock frequency. The device on the receiver side multiplies the reference clock by n by means of a PLL circuit, and latches the data using the clock thus multiplied. On the other hand, with the CDR method, 8 B/10 B encoding is subjected to a serial data sequence so as to embed the clock signal in the serial data sequence. The receiver device extracts the clock signal from the serial data sequence, reproduces the clock signal thus extracted, and latches each data item contained in the serial data sequence.

Patent Document 1

Japanese Patent Application Laid Open No. H07-280884

Accordingly, with the forwarded clock method and the CDR method, the transmission rate is affected not only by the transmitter device but also by the receiver device.

SUMMARY OF THE INVENTION

The present invention has been made in order to solve such a problem. Accordingly, it is an exemplary purpose of the present invention to provide a technique for emulating a receiver device in a test operation when the test apparatus tests the transmitter device.

An embodiment of the present invention relates to a test apparatus. A device under test outputs a clock signal and a data sequence (data signal) which is transmitted in synchronization with the clock signal and which contains n (n represents an integer of 2 or more phases of data for each cycle of the clock signal.

The test apparatus includes a first time to digital converter, a second time to digital converter, a first transform unit, a filter, a second transform unit, a calculation unit, and a judgment unit.

The first time to digital converter is configured to receive the clock signal, and to generate clock change point information which represents a change timing of the clock signal. The second time to digital converter is configured to receive the data sequence in increments of cycles of the clock signal, and to generate data change point information which represents a change timing of the data sequence in increments of phases of the data. The first transform unit is configured to transform the clock change point information into information with respect to the frequency domain so as to generate first clock change point frequency information. The filter has predetermined frequency characteristics, and is configured to perform filtering of the first clock change point frequency information so as to generate second clock change point frequency information. The calculation unit is configured to calculate difference data between the change timing represented by the data change point information and the change point timing represented by the clock change point information in increments of phases. The judgment unit is configured to evaluate the device under test based upon the difference data received from the calculation unit.

With such an embodiment, where a change point (edge) does not exist at a given phase in the clock signal, it is assumed that a virtual change point indicated by the clock change point information exists at this phase. With such an arrangement, by comparing the virtual change timing of the clock signal with the change timing for each data item, the device under test can be evaluated. Furthermore, by calculating the transformation of the clock change point information into the frequency domain, such an arrangement is capable of emulating the characteristics of the second device which is a communication partner of the device under test.

It should be noted that any combination of the aforementioned components may be made, and any component of the present invention or any manifestation thereof may be mutually substituted between a method, apparatus, and so forth, which are effective as an embodiment of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
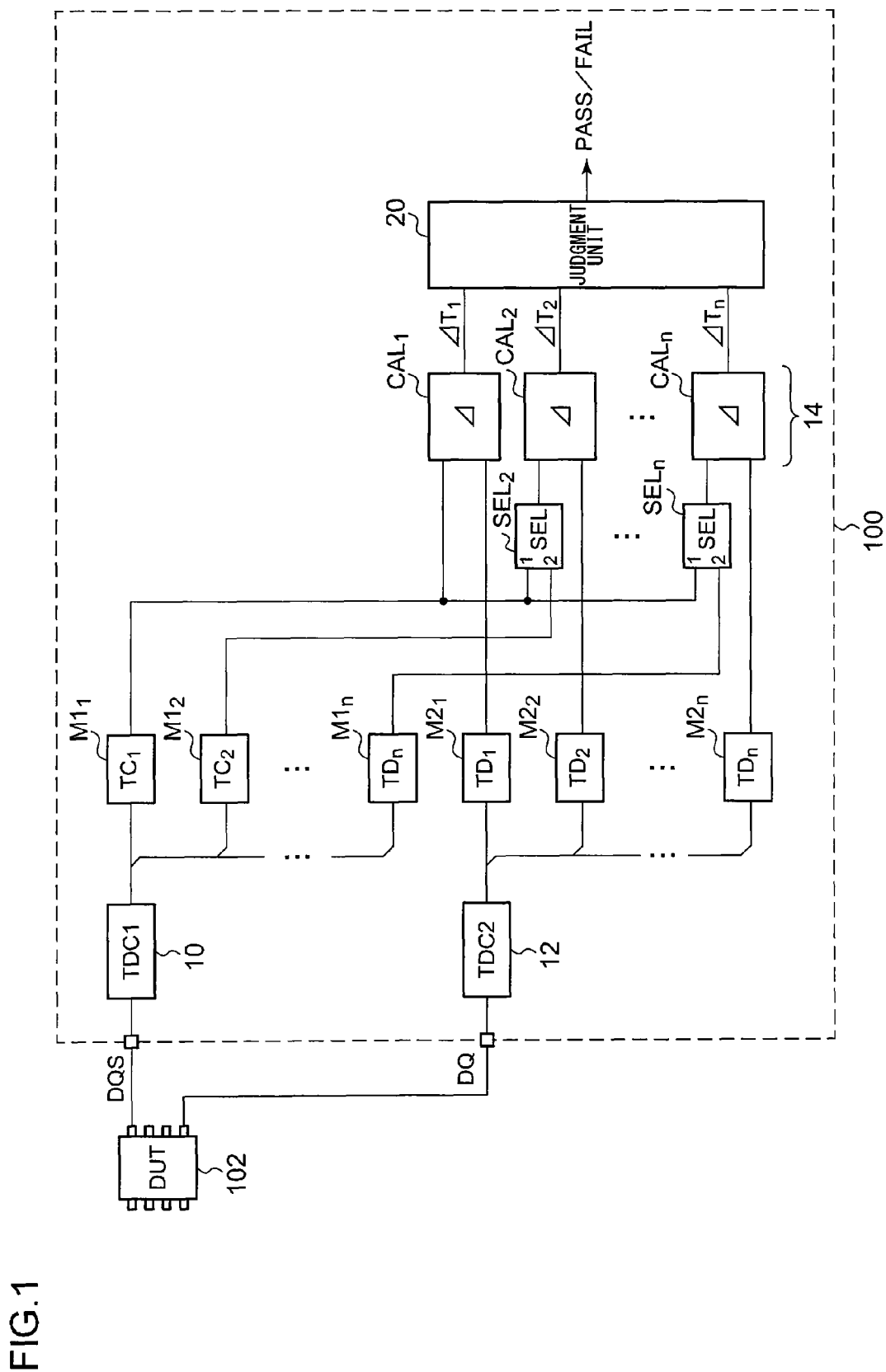
FIG. 1 is a block diagram which shows a configuration of a test apparatus according to an embodiment.

Description will be made below regarding preferred embodiments according to the present invention with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

In the present specification, a state represented by the phrase "the member A is connected to the member B" includes a state in which the member A is indirectly connected to the member B via another member that does not affect the electric connection therebetween, in addition to a state in which the member A is physically and directly connected to the member B. Similarly, a state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Furthermore, in the following description, in a case in which only one edge type (positive edge or negative edge) is used in signal processing, the term "clock signal cycle" represents a period of time between one of these edges of a clock signal and the next corresponding edge. Also, in a case in which both clock signal edge types are used in the signal processing, the term "clock signal cycle" represents an interval between a positive edge and the next negative edge (e.g., a half cycle). The same can be said of the frequency of the clock signal.

Figure 2:
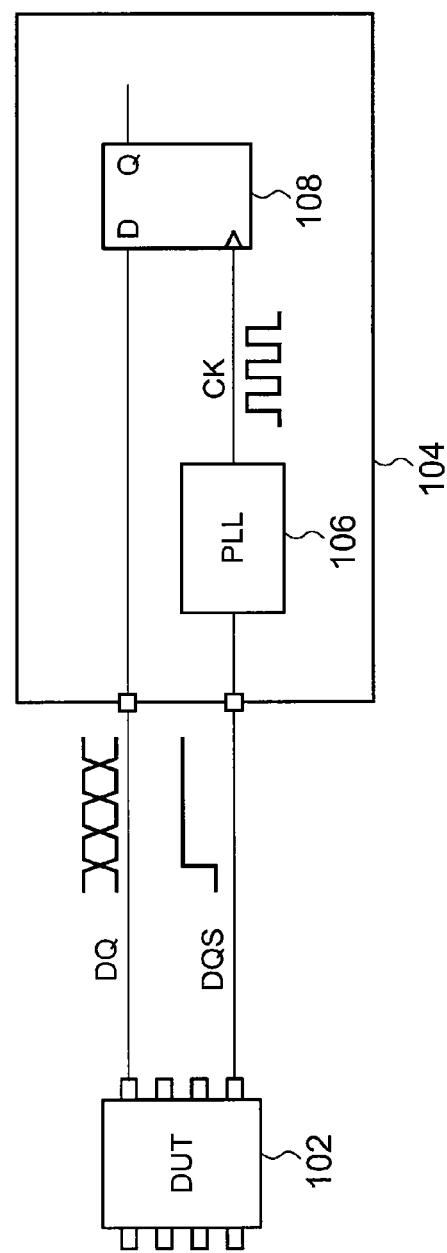
FIG. 2 is a block diagram which shows a device to be tested by the test apparatus shown in FIG. 1, and a second device to be connected in the actual usage.

FIG. 1 is a block diagram which shows a configuration of a test apparatus 100 according to an embodiment. FIG. 2 is a block diagram which shows a device to be tested by the test apparatus 100 shown in FIG. 1 (which will be referred to as "DUT" hereafter) and a second device which is a transmission destination connected to the DUT in the actual test operation.

First, description will be made regarding a transmission method employed in a DUT 102 to be tested by the test apparatus 100 shown in FIG. 1. The DUT 102 outputs a clock signal DQS and a data signal DQ. The data signal DQ is transmitted in synchronization with the clock signal DQS, and is a data sequence containing n (n is an integer of 2 or more) phases of data for each cycle of the clock signal DQS. Seen from a different point of view, the frequency of the data signal DQ is n times the frequency of the clock signal DQS. For example, with a forwarded clock transmission method, the transmission frequency of the data signal DQ is eight times the frequency of the clock signal DQS.

A second device 104, which is a communications partner of the DUT 102, includes a PLL circuit 106 and a latch circuit 108 as an interface circuit. The PLL circuit 106 receives the clock signal DQS, and multiplies the frequency of the clock signal DQS by n. The clock thus multiplied will be referred to as the "multiplied clock CK". The frequency of the multiplied clock matches the frequency of the data signal DQ output from the DUT 102. At the timing of each edge of the multiplied clock CK, the latch circuit 108 latches the value of the corresponding data. The data Q thus latched is supplied to a downstream circuit.

The above is the transmission method used to transmit data between the DUT 102 and the second device 104. With such a transmission method, there is a need to satisfy the setup time and the hold time requirements between each edge of the multiplied clock CK and the corresponding data signal DQ.

Returning to FIG. 1, description will be made regarding a configuration of the test apparatus 100. The test apparatus 100 receives the clock signal DQS and the data signal DQ output from the DUT 102. As described above, the data signal DQ is transmitted in synchronization with the clock signal DQS, and is transmitted in the form of a data sequence comprising n phases of data $D_1$ through $D_n$ for each cycle of the clock signal DQS.

The test apparatus 100 includes, as principal components, a first time to digital converter 10, a second time to digital converter 12, a calculation unit 14, and a judgment unit 20.

The first time to digital converter 10 receives the clock signal DQS, and generates clock change point information (TC) which indicates the timing at which the clock signal DQS changes.

For example, the first time to digital converter 10 may generate clock change point information items $TC_1$ through $TC_n$ which indicate the timing at which the clock signal DQS changes for each phase. An effective change point occurs in the clock signal DQS only at the k-th phase ($1 \leq k \leq n$) among n phases generated for each cycle of the clock signal DQS. Accordingly, among the multiple clock change point information items $TC_1$ through $TC_n$, only the clock change point information item $TC_k$ with respect to the phase that corresponds to the effective change point is used to perform the downstream signal processing. Description will be made below assuming that an effective change point occurs in the clock signal DQS at the phase k=1.

The second time to digital converter 12 receives a data sequence transmitted with the frequency of the clock signal DQS as a unit frequency. Furthermore, the second time to digital converter 12 generates data change point information items $TD_1$ through $TD_n$ which indicate the data change (transition) timings in increments of phases of data $D_1$ through $D_n$.

Figure 3:
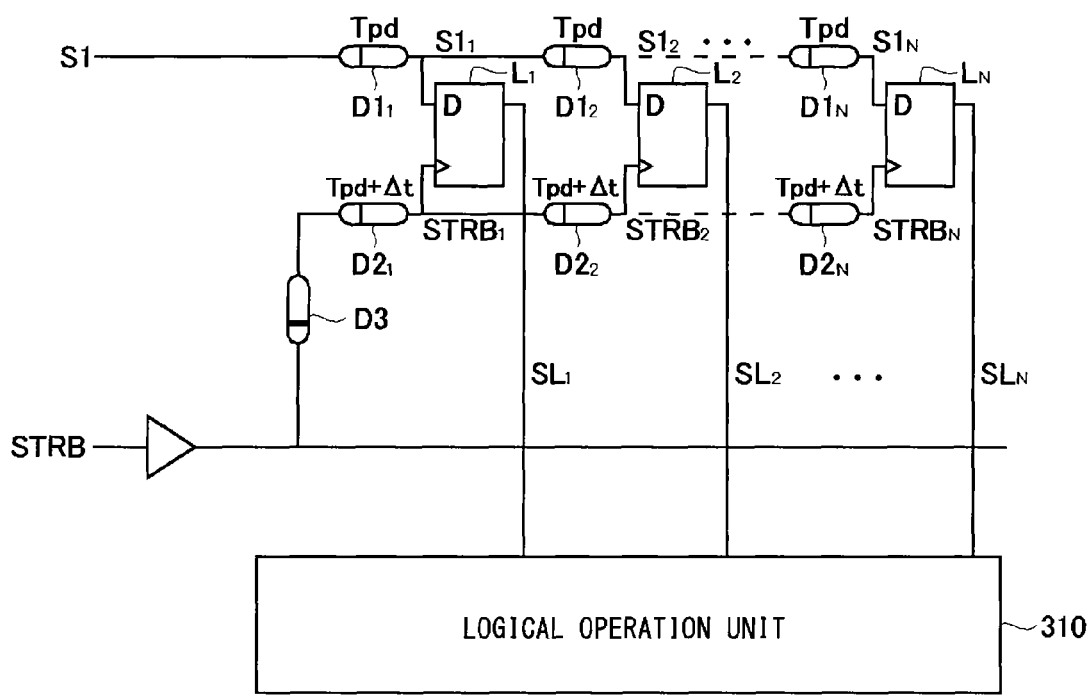
FIG. 3 is a circuit diagram which shows an example configuration of a multi-strobe circuit.

As the first time to digital converter 10 and the second time to digital converter 12, various kinds of time to digital converters can be employed, configured to convert time to a digital value. For example, such a time to digital converter can be configured as a multi-strobe circuit. FIG. 3 is a circuit diagram which shows an example configuration of a multi-strobe circuit 300.

The multi-strobe circuit 300 receives a signal (signal under test) S1 to be tested, judges the value of the signal under test S1 in increments of edge timings of the multi-strobe signal MSTRB ($STRB_1$ through $STRB_N$) having multiple edges, and generates a signal which indicates the change timing of the signal under test S1. It should be noted that the integer N is determined independent of the integer n shown in FIG. 1.

A vernier method is employed in the multi-strobe circuit 300 shown in FIG. 3. N first delay elements (which will be collectively referred to as the "first delay elements D1") $D1_1$ through $D1_N$ are cascade-connected in multiple stages. A signal under test S1 is input to a first delay element $D1_1$ provided as the first stage delay. A predetermined delay Tpd is applied to the signal under test S1 each time the signal under test S1 passes through a first delay element D1. That is to say, the i-th first delay element $D1_i$ outputs the signal under test $S1_i$ which has been delayed by (i×Tpd) with respect to the signal under test S1 output from the DUT.

N second delay elements $D2_1$ through $D2_N$ (which will be collectively referred to as the "second delay elements D2") are provided in increments of the N first delay elements $D1_1$ through $D1_N$, and are cascade-connected in a multi-stage manner. A strobe signal STRB, which is used as a reference signal, is input to the second delay element $D2_1$ provided as the first stage delay. A predetermined delay (Tpd+Δt) is applied to the strobe signal STRB each time the strobe signal STRB passes through a stage of the second delay element D2. Thus, the i-th second delay element D2 outputs the strobe signal $STRB_i$ which has been delayed by (i×(Tpd+Δt)) with respect to the reference strobe signal STRB. The multiple strobe signals $STRB_1$ through $STRB_N$ thus generated will be collectively referred to as the "multi-strobe signals MSTRB".

Furthermore, N latch circuits $L_1$ through $L_N$ (which will also be referred to as the "timing comparators") are provided in increments of the N first delay elements $D1_1$ through $D1_N$. The i-th (i represents an integer that satisfies the relation 1≦i≦N) latch circuit $L_i$ latches the output signal of the i-th first delay element $D1_i$ at a timing of an edge of the i-th phase strobe signal $STRB_i$. That is to say, the value of the signal under test S1 is judged at timings defined by the N strobe signals (multi-strobe signals) $STRB_1$ through $STRB_N$, which have different phases shifted in increments of Δt.

It is needless to say that the latch circuit L1 configured as a D flip-flop shown in FIG. 1 can be replaced with various kinds of elements, examples of which include other kinds of flip-flops, latch circuits, etc. The output signals $SL_1$ through $SL_N$ of the N latch circuits $L_1$ through $L_N$ are input to a logical operation unit 310. The logical operation unit 310 performs predetermined signal processing according to the test items for the DUT, and outputs the signal processing result as change point information (TC or TD).

A third delay element D3, which is provided as a component upstream of the N second delay elements D2, adjusts the phase difference (timing) between the signal under test S1 input to the first delay elements D1 and the strobe signal STRB input to the second delay elements D2.

Description will be made regarding the multi-strobe circuit 300.

The relative time difference between the signal under test S1 and the strobe signal STRB changes by Δt every time the signal under test S1 passes through a stage of the first delay element D1 and the strobe signal STRB passes through a stage of the second delay element D2. In a case in which the initial time difference between the signal under test S1 and the strobe signal STRB is τ, after the signal under test S1 and the strobe signal STRB each pass through (τ/Δt) delay stages, the timings of the edges of the two signals are reversed. In the values of the output signals $SL_1$ through $SL_N$ of the latch circuits, there is a change point at a position at which the timings of the two edges are reversed.

Accordingly, the position at which the value changes in the output signals $SL_1$ through $SL_N$ indicates the timing at which the level of the signal under test S1 changes. With such an arrangement, the output signals $SL_1$ through $SL_N$ provide a thermometer code, in which the value changes between 1 and 0 at a boundary defined by a particular bit that corresponds to the change point. Accordingly, the logical operation unit 310 may include a priority encoder configured to convert a thermometer code to a binary code.

Also, a modification may be effectively made by eliminating the first delay elements D1 from the configuration shown in FIG. 3, i.e., by setting Tpd to zero, thereby applying a delay to only the strobe signal STRB side.

The above is the schematic configuration of the multi-strobe circuit 300 and the operation thereof. By employing the multi-strobe circuit 300 as the time to digital converters 10 and 12 shown in FIG. 1, the change timing can be appropriately detected.

Returning to FIG. 1, the calculation unit 14 generates the phase difference data $\Delta T_i$, in increments of phases i (1≦i≦n), between the change timing indicated by the data change point information item $TD_i$ of the respective phase and the change point timing indicated by the clock change point information item $TC_k$. Here, the integer k represents the phase at which an effective change point is generated in the clock signal DQS, as described above.

In FIG. 1, the calculation unit 14 includes n calculation components $CAL_1$ through $CAL_n$. The calculation components $CAL_1$ through $CAL_n$ are provided in increments of phases. The i-th phase (1≦i≦n) calculation component $CAL_i$ receives the clock change point information item $TC_k$ and the corresponding i-th phase data change point information item $TD_i$. The calculation component $CAL_i$ calculates the phase difference data $\Delta T_i$ between the change timing of the clock signal DQS indicated by the clock change point information item $TC_k$ and the change timing indicated by the i-th phase data change point information item $TD_i$.

The judgment unit 20 evaluates the DUT 102 based upon the n phase difference data items $\Delta T_1$ through $\Delta T_n$. For example, the judgment unit 20 calculates the minimum value, the maximum value, or the average value with respect to the phase difference data items $\Delta T_1$ through $\Delta T_n$. Furthermore, the judgment unit 20 judges whether or not each value thus calculated is within a specified range determined beforehand, thereby judging the quality or the performance of the DUT 102.

Figure 4:
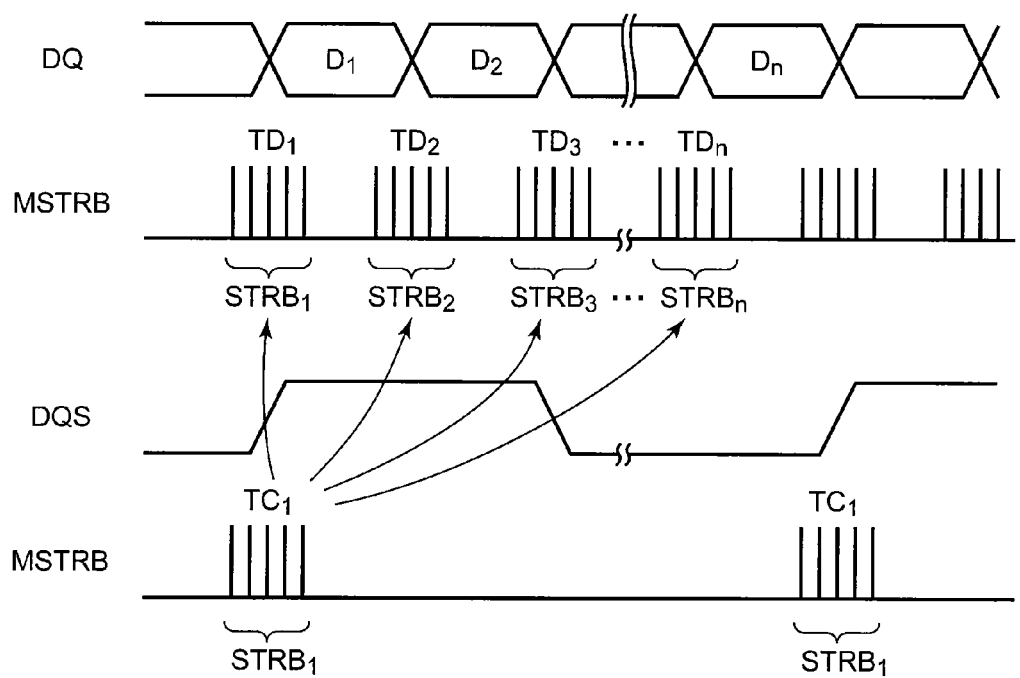
FIG. 4 is a time chart which shows a basic operation of the test apparatus shown in FIG. 1.

The above is the basic configuration of the test apparatus 100. Next, description will be made regarding the operation thereof. FIG. 4 is a time chart which shows the basic operation of the test apparatus 100 shown in FIG. 1.

As shown in FIG. 4, a change point (positive edge) in the clock signal DQS exists only at the k-th phase. That is to say, no change point exists at phases other than the k-th phase. Accordingly, from the clock change point information items $TC_1$ through $TC_n$, only the item with respect to the k-th (k=1) phase is acquired as an effective value.

It is assumed that change points, which are defined based on the change point indicated by the clock change point information item $TC_1$ acquired at the k-th phase (k=1), exist at each of the second phase through the n-th phase, at which no change points exist in the clock signal DQS. That is to say, the calculation components $CAL_2$ through $CAL_n$ respectively compare virtual change points thus defined with the data change timings $TD_2$ through $TD_n$.

With the test apparatus 100 shown in FIG. 1, even for phases where no edge (change point) exists, by means of generating the virtual phases of the clock signal, it becomes possible for the test apparatus 100 to perform the evaluation operation.

The above is the operation of the test apparatus 100. Next, returning to FIG. 1, detailed description will be made regarding the configuration thereof.

The test apparatus 100 shown in FIG. 1 includes n first memory units $M1_1$ through $M1_n$, n second memory units $M2_1$ through $M2_n$, and multiple selectors $SEL_2$ through $SEL_n$.

As described above, in the n phases of clock change point information items $TC_1$ through $TC_n$ thus generated, only one clock change point information item (for the first phase in an example shown in FIG. 1) represents an effective change point. The other clock change point information items are meaningless. Accordingly, in this case, the n calculation components $CAL_1$ through $CAL_n$ must perform calculation using the clock change point information item $TC_1$ acquired at a phase having an effective change point.

The first memory units $M1_1$ through $M1_n$ respectively hold the clock change point information items $TC_1$ through $TC_n$, in increments of phases. The first time to digital converter 10 distributes the clock change point information items $TC_1$ through $TC_n$, which have been acquired in increments of phases, to the multiple first memory units by interleaving.

In the same way, the second memory units $M2_1$ through $M2_n$ respectively hold the data change point information items $TD_1$ through $TD_n$, in increments of phases. The second time to digital converter 12 distributes the data change point information items $TD_1$ through $TD_n$, which have been acquired in increments of phases, to the multiple second memory units by interleaving.

The selectors $SEL_2$ through $SEL_n$ are provided in increments of phases. The i-th phase selector $SEL_i$ receives, via a first input terminal (1), the clock change point information item $TC_k$ from the k-th phase first memory unit $M1_k$, and receives, via a second input terminal (2), the clock change point information item $TC_i$ from the i-th phase first memory unit $M1i$. The selector $SEL_i$ selects one of the two clock change point information items thus received, according to a control signal. If the k-th selector $SEL_k$ is provided, it receives the same k-th phase clock change point information item $TC_k$ via the two input terminals, which is a redundancy. Thus, the k-th selector $SEL_k$ can be eliminated.

With such an arrangement, the i-th phase calculation component $CAL_i$ receives the clock change point information from the i-th phase selector $SEL_i$, receives the data change point information $TD_i$ held by the j-th phase second memory $M2_j$, and calculates the difference therebetween.

By providing the selectors $SEL_2$ through $SEL_n$, such an arrangement allows the calculation component $CAL_i$ that corresponds to the i-th phase ($1 \leq i \leq n$) to selectively receive one of the k-th phase clock change information $TC_k$ and the i-th phase clock change point information $TC_i$.

Description will be made below regarding the advantage of such a configuration. The DUT 102 to be connected to the test apparatus 100 does not necessarily perform data transmission described with reference to FIG. 2. That is to say, in order to improve the versatility of the test apparatus 100, there is a need to provide a function of handling a case in which the clock signal DQS and the data signal DQ have the same frequency.

(a) A Case in Which the Frequency of the Clock Signal DQS is n Times the Frequency of the Data Signal DQ The first input terminals (1) of the selectors $SEL_2$ through $SEL_n$ are respectively selected. As a result, such an arrangement provides the operation shown in the time chart in FIG. 4.

(b) A Case in Which the Frequency of the Clock Signal DQS is the Same as That of the Data Signal DQ In this case, an effective change point is generated at each phase. Thus, the second input terminals (2) of the selectors $SEL_2$ through $SEL_n$ are respectively selected. As a result, such an arrangement is capable of comparing each of the change points $D_1$ through $D_n$ with the corresponding clock signal change point in increments of phases.

Instead of the selectors $SEL_2$ through $SEL_n$, such an arrangement may include selectors in increments of phases, configured to receive the clock change point information items $TC_1$ through $TC_n$ and to select one of the clock change point information items $TC_1$ through $TC_n$ thus received, and to receive the data change point information items $TD_1$ through $TD_n$ and to select one of the data change point information items $TD_1$ through $TD_n$ thus received.

Figure 5:
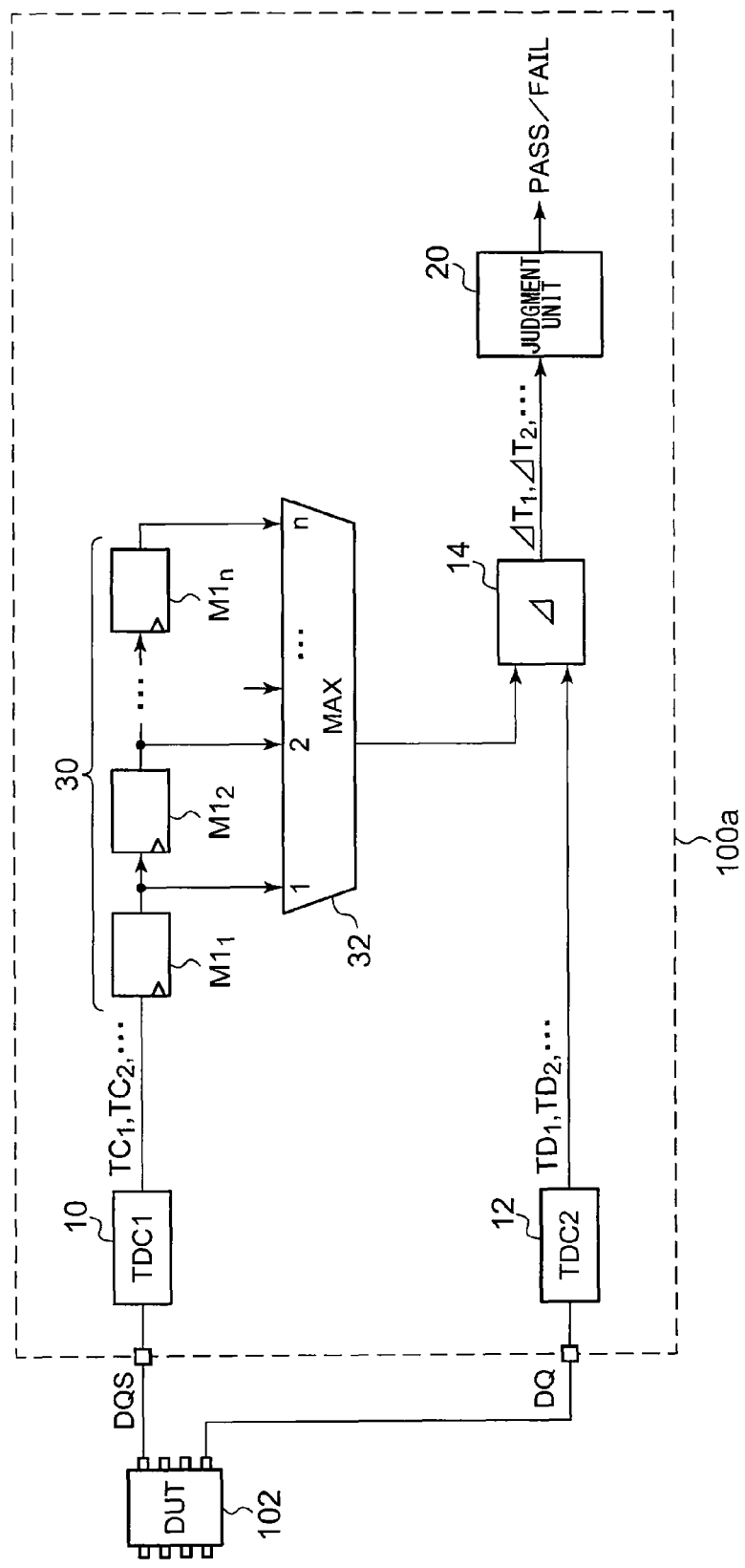
FIG. 5 is a block diagram which shows a modification of the test apparatus shown in FIG. 1.

FIG. 5 is a block diagram which shows a modification of the test apparatus shown in FIG. 1. The test apparatus 100 shown in FIG. 1 employs the interleaving method. In contrast, a test apparatus 100a shown in FIG. 5 employs a non-interleaving method.

The test apparatus 100a shown in FIG. 5 includes a shift register 30 and a selector (multiplexer) 32. As an input signal, the shift register 30 sequentially receives the clock change point information items $TC_1$, $TC_2$, ..., output from the first time to digital converter 10 in increments of phases. The shift register 30 has a configuration including at least n stages. It can be understood that the stages of the shift register 30 respectively correspond to the first memory units $M1_1$ through $M1_n$ shown in FIG. 1.

The selector 32 selects one of the clock change point information items TC stored in the stages of the shift register 30.

The calculation unit 14 calculates the phase difference data $\Delta T_1$, $\Delta T_2$, which are differences between the clock change point information item TC selected by the selector 32 and the data change point information items $TD_1$, $TD_2$, ..., sequentially output from the second time to digital converter 12 in increments of phases.

Description will be made below regarding the operation of the test apparatus 100a shown in FIG. 5.

(a) A Case in Which the Frequency of the Clock Signal DQS is n Times the Frequency of the Data Signal DQ When an effective change point of the clock signal DQS occurs at a k-th phase, the clock change point information item $TC_k$ is sequentially shifted over the shift register 30. In order to pursue the shift in the clock change point information item $TC_k$, the stage selected by the selector 32 is sequentially shifted in increments of stages. As a result, the calculation unit 14 receives the clock change point information item $TC_k$ having an effective change point, thereby providing the operation shown in the time chart in FIG. 4.

(b) A Case in Which the Frequency of the Clock Signal DQS is the Same as That of the Data Signal DQ In this case, the selector 32 always selects the clock change point information item stored at the first stage of the shift register 30. As a result, the selector 32 sequentially outputs the clock change point information items $TC_1$, $TC_2$, ..., in increments of phases. With such an operation, the calculation unit 14 is capable of sequentially generating the phase difference data items $\Delta T_i$, which are differences between the data change point information item $TD_i$ and the corresponding clock change point information item $TC_i$ in increments of phases.

The test apparatus 100 according to the embodiment may further include the following functions.

[Function 1] Function of Measuring Phase Fluctuations in the Phases of the Clock Signal and the Data Signal In a case of employing a multi-strobe circuit, such an arrangement is capable of data acquisition up to the Nyquist interval without reduction in the bandwidth. Thus, such an arrangement is capable of measuring the phase fluctuation that occurs due to inter-symbol interference (ISI) etc.

Figure 6:
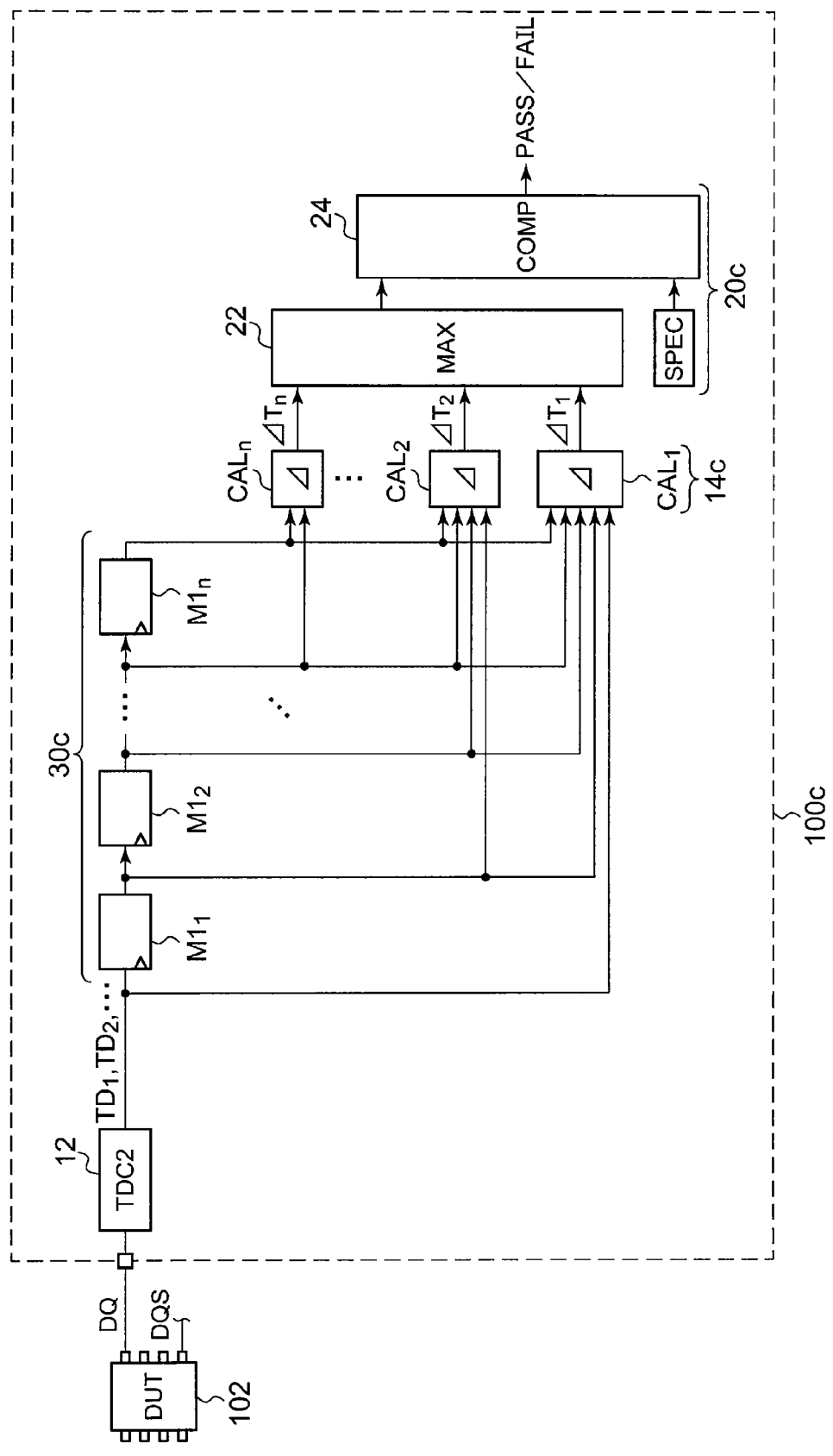
FIG. 6 is a circuit diagram which shows a configuration for measuring the phase fluctuation.

FIG. 6 is a circuit diagram which shows a configuration for measuring the phase fluctuation. FIG. 6 shows only a circuit for processing the data signal DQ. Also, an equivalent configuration may be made for the clock signal DQS. Also, a single configuration may be made for processing either one of the data signal DQ or the clock signal DQS.

A shift register 30c sequentially receives, as an input signal, the data change point information items $TD_1, TD_2, \ldots$, output from the second time to digital converter 12 in increments of phases. The shift register 30c has a configuration including at least n stages. It can be understood that the stages of the shift register 30c respectively correspond to the second memory units $M2_1$ through $M2_n$ shown in FIG. 1.

A calculation unit 14c shown in FIG. 6 includes calculation components $CAL_1$ through $CAL_n$ provided in increments of stages of the shift register 30c. The calculation component $CAL_j$ that corresponds to the j-th stage receives, as an input signal, the data change point information items $TD_j$ through $TD_n$ with respect to the j-th stage up to the n-th stage of the shift register 30c.

The calculation component $CAL_j$ calculates the difference between two adjacent or nonadjacent data change point information items TD. The difference between the two data change point information items TD represents the phase fluctuation (jitter amount) in the data signal DQ.

A judgment unit 20c includes a maximum value circuit 22 and a comparison circuit 24. The maximum value circuit 22 detects the maximum value of the phase difference data received from the calculation components $CAL_1$ through $CAL_n$, i.e., the maximum value of the phase fluctuation. The comparison circuit 24 judges the quality of the DUT 102 by comparing the maximum value of the phase fluctuation with predetermined specifications data SPEC.

Figure 7:
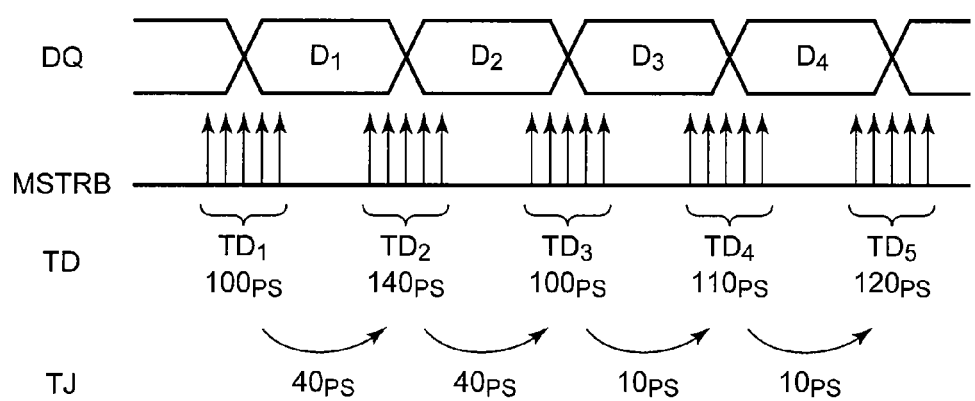
FIG. 7 is a time chart for describing the phase fluctuation in the data signal tested by the test apparatus shown in FIG. 6.

FIG. 7 is a time chart for describing the phase fluctuation in the data signal DQ to be tested by the test apparatus 100c shown in FIG. 6. In the time chart shown in FIG. 7, the phase difference data ΔT represents the phase fluctuation in adjacent phases. For example, in a case in which the allowable phase fluctuation value is set to 30 ps in the specifications, the fluctuations with respect to the difference between the first phase and the second phase and the difference between the third phase and the fourth phase are 40 pS, and are each greater than the allowable value defined in the specifications. Accordingly, the judgment unit 20c judges that the DUT is defective.

[Function 2] Function for Emulating the Second Device Which is a Communication Destination of the DUT 102

With the test apparatus shown in FIG. 1 or FIG. 3, where no change point exists at a phase in the clock signal DQS, it is assumed that a virtual change point exists at this phase, and the k-th phase clock change point information item $TC_k$ for the k-th phase, at which an actual change point exists, is used uniformly for all the phases.

On the other hand, in the actual usage shown in FIG. 2, the data signal DQ is multiplied by n by means of the PLL circuit of the second device 104, and the data at each phase is latched using the corresponding edge of the multiplied clock signal CK. Each edge of the multiplied clock signal CK is nothing but the virtual change point determined by the test apparatus 100. It is known that frequency drift occurs in a multiplied clock signal CK thus generated by the PLL circuit 106. That is to say, each edge of the multiplied clock signal CK is generated having jitter TJ that corresponds to the performance of the PLL circuit 106.

Figure 8A:
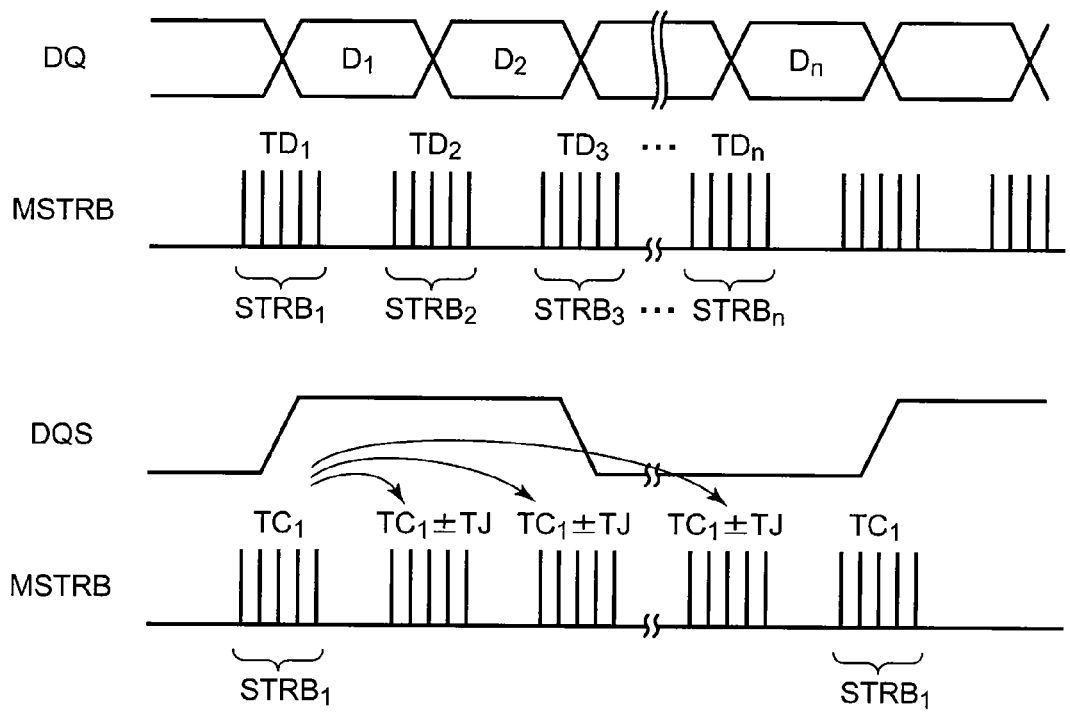
FIGS. 8A and 8B are diagrams for describing jitter superimposed on the multiplied clock signal in the operation of a PLL circuit included in a second device.
Figure 8B:
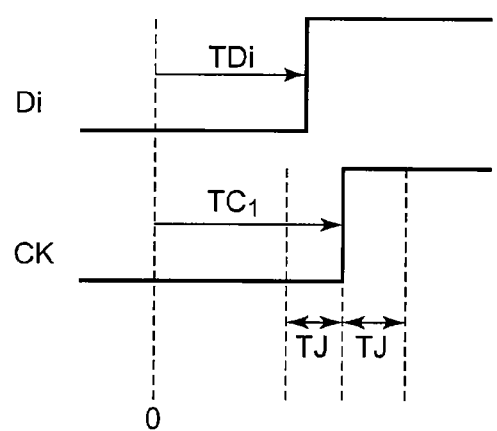

FIGS. 8A and 8B are diagrams for describing jitter that is superimposed on the multiplied clock signal CK at the PLL circuit included in the second device. For example, due to the influence of jitter that occurs at the PLL circuit 106, in a case in which the phase (change point) of each edge of the multiplied clock signal CK fluctuates in a range of ±TJ, the change points at the second phase through the n-th phase can fluctuate in a range of ±TJ with respect to the change point indicated by the first phase clock change point information item $TC_1$ (FIG. 8A).

Thus, assuming that each virtual change point of the clock signal is generated in a range of $TC_1 \pm TJ$, the test apparatus 100 according to the embodiment compares each change point with the corresponding phase data change point information items $TD_1$ through $TD_n$ (FIG. 8B).

Figure 9:
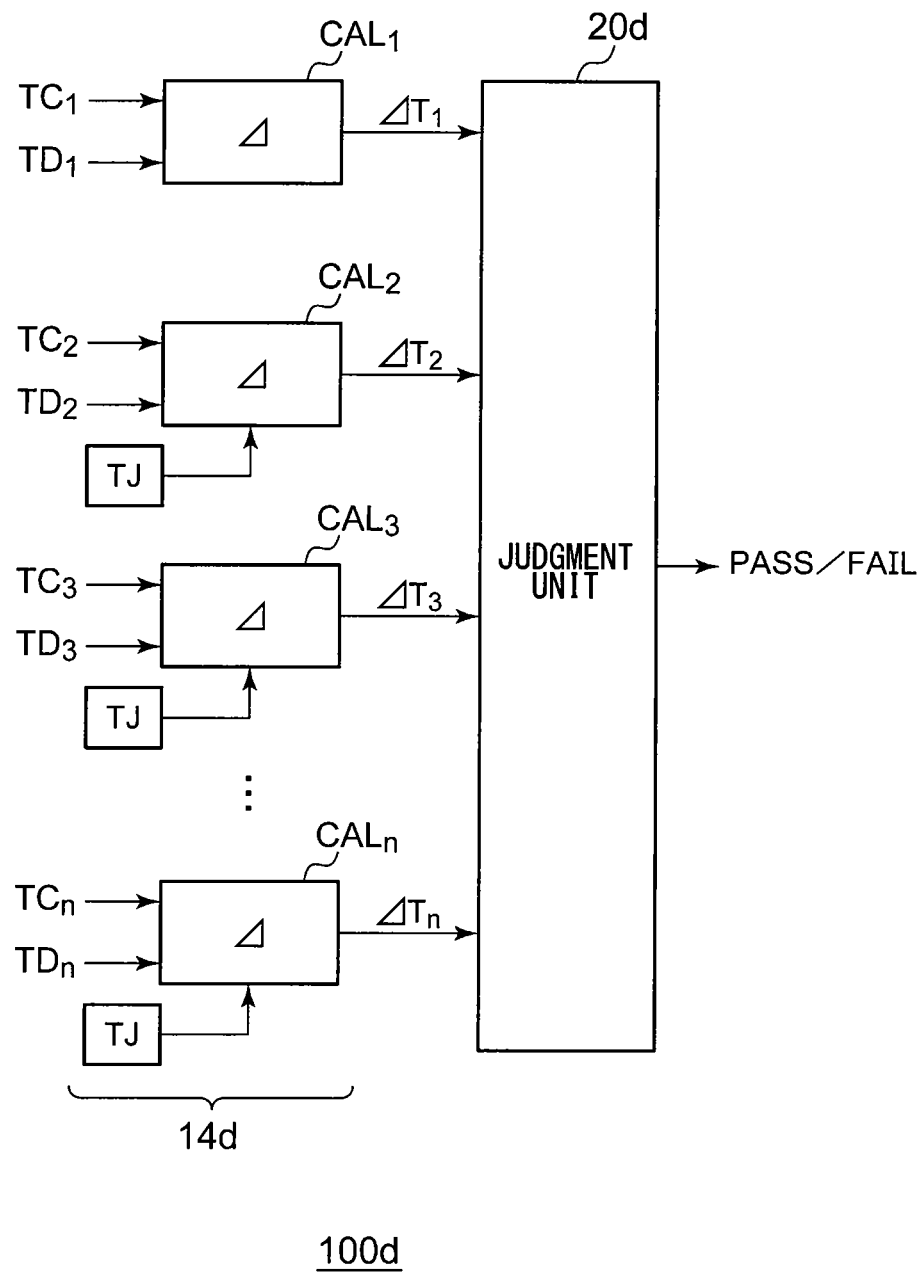
FIG. 9 is a diagram which shows a portion of an example configuration of a test apparatus having a function of emulating the second device.

FIG. 9 is a diagram which shows a portion of an example configuration of a test apparatus 100d having an emulation function for emulating the second device 104.

A calculation unit 14d holds data which represents the jitter amount TJ acquired beforehand. Different jitter amounts TJ may be employed in increments of phases. Also, the same jitter amount may be employed for all phases. Also, the same jitter amount may be employed for the forward phase direction and the reverse phase direction. Also, different jitter amounts may be employed for the forward phase direction and the reverse phase direction.

The calculation components $CAL_2$ through $CAL_n$ each receive, as an input signal, the jitter amount TJ. The j-th phase calculation component $CAL_j$ calculates the difference between $TD_j$ and $TC_1$, and adds or subtracts TJ to or from the difference thus calculated. It should be noted that the calculation component $CAL_1$ may perform calculation giving consideration to the jitter amount TJ.

The judgment unit 20d judges whether or not the phase difference data $\Delta T_1$ through $\Delta T_n$ received from the calculation unit 14d satisfies the specifications. It should be noted that, instead of calculation of the jitter amount TJ at the calculation unit 14d, the judgment condition used by the judgment unit 20d may be generated giving consideration to the jitter amount TJ, which provides the same processing.

With the present embodiment, judgment can be made whether or not the DUT 102 operates normally in the actual operation.

The test apparatus 100d shown in FIG. 9 may employ the interleaving method, instead of the shift register method.

(3) Judgment and Analysis of the Frequency Domains of the Clock Signal and the Data Signal An increase in the frequency of the multi-strobe signal MSTRB is equivalent to an increase in the sampling frequency of the clock signal DQS or the data signal DQ. Accordingly, an increase in the frequency of the multi-strobe signal MSTRB enables the frequency component of the clock signal DQS or the data signal DQ to be analyzed.

Figure 10:
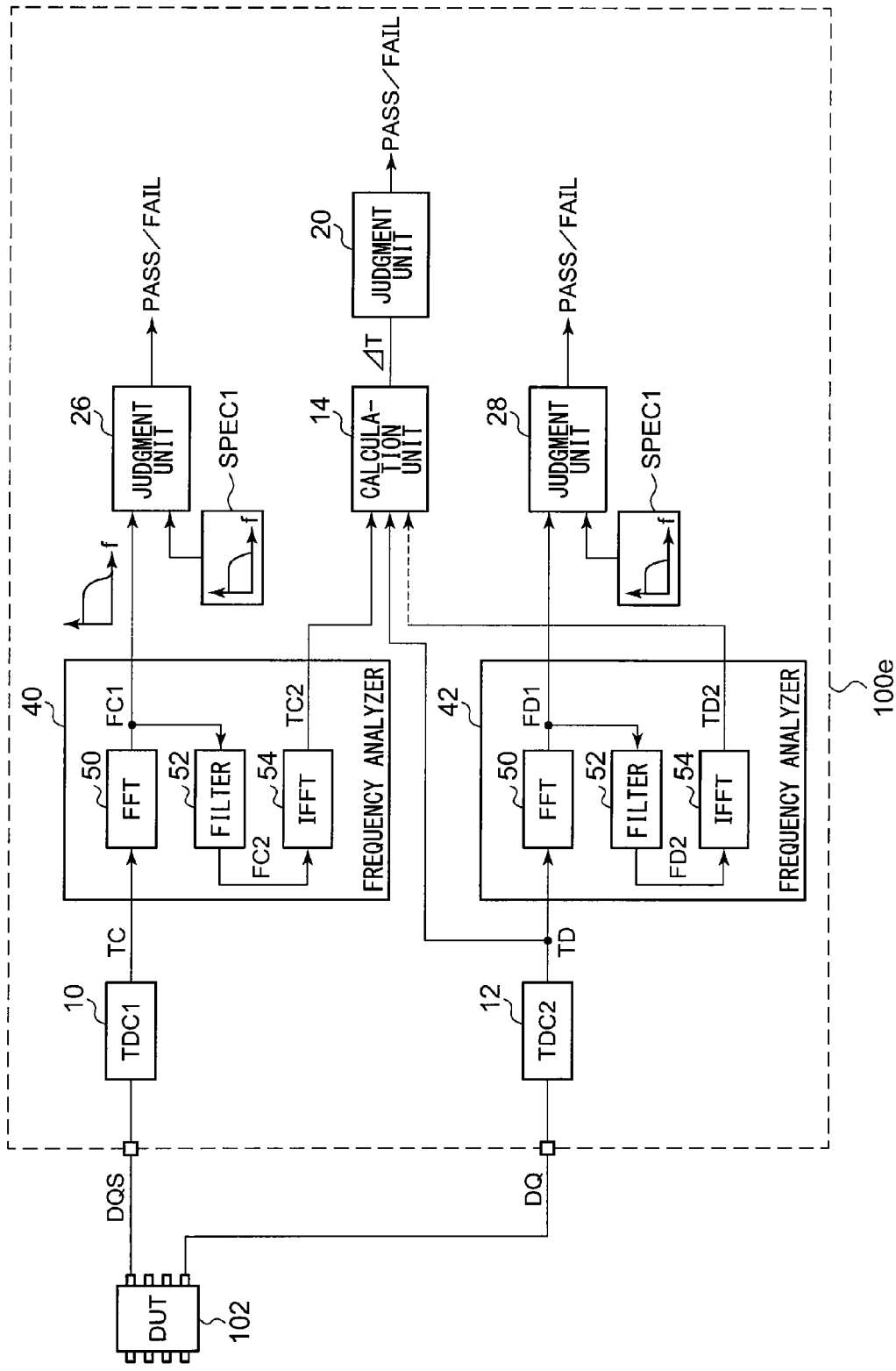
FIG. 10 is a diagram which shows an example configuration of a test apparatus having a frequency analysis function.

FIG. 10 is a diagram which shows an example configuration of a test apparatus 100e having a frequency analysis function. The test apparatus 100e includes a first frequency analyzer 40, a second frequency analyzer 42, and frequency judgment units 26 and 28.

The first frequency analyzer 40 and the second frequency analyzer 42 are each configured as a logic circuit, which has functions such as an FFT (Fast Fourier Transform) function, an IFFT (Inverse Fast Fourier Transform) function, a filtering function, etc., implemented in a software manner or a hardware manner.

The first frequency analyzer 40 includes a first transform unit 50, a filter 52, and a second transform unit 54.

The first transform unit 50 receives the clock change point information TC from the first time to digital converter 10. The first transform unit 50 transforms the clock change point information TC into a signal which represents the frequency domain (first clock change point frequency information FC1) using the FFT function. Description will be made later regarding the filter 52 and the second transform unit 54.

The second frequency analyzer 42 has the same configuration as that of the first frequency analyzer 40. The first transform unit 50 included in the second frequency analyzer 42 transforms the data change point information TD received from the second time to digital converter 12 into a signal which represents the frequency domain (first data change point frequency information FD1).

The frequency judgment units 26 and 28 compare the clock change point frequency information FC and the data change point frequency information FD with the values defined by the specifications SPEC, thereby judging the quality of the DUT 102.

For example, in the actual operation of the DUT 102, the PLL circuit 106 included on the second device 104 side multiplies the clock signal DQS. However, the frequency band of the clock signal DQS that can be followed by the PLL circuit 106 is limited, and if the frequency of the data change point deviates from the allowable frequency band, the PLL circuit 106 cannot maintain the locked state, leading to a transmission error.

Where the frequency of the clock signal DQS output from the DUT 102 is shifted, or where the jitter amount becomes large, it leads to a wider frequency spectrum or the occurrence of spurious signals. This leads to deviation in the frequency domain from the allowable frequency band of the PLL circuit 106. Accordingly, it is very significant to analyze the frequency components of the clock signal DQS.

With such an arrangement, the frequency judgment unit 26 compares the frequency components of the clock signal DQS represented by the clock change point frequency information FC with the predetermined frequency band defined by the specifications SPEC, thereby judging the quality of the DUT 102. For example, when the spectrum component represented by the clock change point frequency information FC deviates from the range FPLL determined based upon the allowable frequency band of the PLL circuit 106, judgment may be made that the DUT 102 is defective. The specifications SPEC for the allowable frequency band may be determined based upon factors other than those that relate to the PLL circuit 106.

Figure 11:
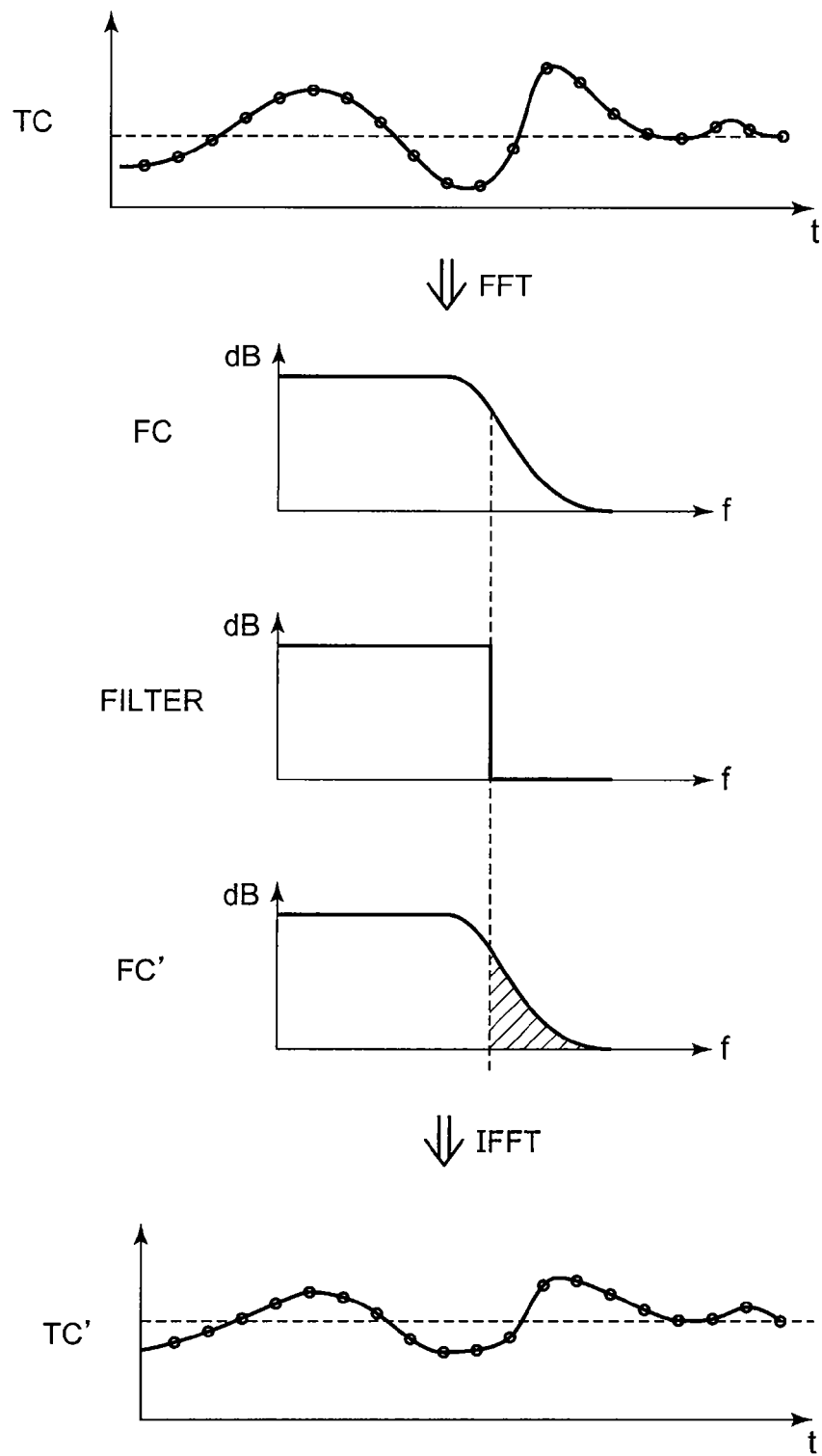
FIG. 11 is a diagram which shows processing performed by the test apparatus shown in FIG. 10.

The test apparatus 100e may perform the following processing. FIG. 11 is a diagram which shows processing performed by the test apparatus 100e shown in FIG. 10.

1. The first transform unit 50 included in the first frequency analyzer 40 transforms the clock change point information TC into the first clock change point frequency information FC1 using the FFT function.

2. The filter 52 included in the first frequency analyzer 40 performs filtering of the first clock change point frequency information FC1 so as to generate second clock change point frequency information FC2. The filter 52 preferably has frequency characteristics which can be adjusted in a programmable manner.

3. Using the IFFT function, the second transform unit included in the first frequency analyzer 40 inverse transforms the second clock change point information FC2 thus subjected to filtering into a signal which represents the time domain (second clock change point information TC2). The second clock change point information TC2 thus obtained is output to the calculation unit 14 provided as a downstream component.

4. The calculation unit 14 calculates the phase difference data $\Delta T_1$ through $\Delta T_n$ which are differences between the second clock change point information TC2 and the data change point information TD in increments of phases.

5. The judgment unit 20 judges the quality of the DUT 102 based upon the phase difference data $\Delta T_1$ through $\Delta T_n$.

The second time to digital converter 12 and the second frequency analyzer 42 may perform the same processing as described above, for the data signal DQ. In this case, the second frequency analyzer 42 outputs the second data change point information TD2. The calculation unit 14 may calculate the difference between the second clock change point information TC2 and the data change point information TD2.

In the aforementioned step 2, the frequency characteristics of the filter 52 may be determined based upon the allowable frequency band of the PLL circuit 106 included in the second device 104. With such an arrangement, the second clock change point information TC2 represents a value obtained by emulating the change point of the multiplied clock signal which is generated by the PLL circuit 106 in the actual operation of the second device 104.

With such an arrangement, the calculation unit 14 provided as a downstream component judges the quality of the DUT 102 based upon the difference $\Delta T$ between the second clock change point information TC2 and the data change point information TD. Thus, such an arrangement is capable of judging whether or not the second device 104 can receive data with high precision in the actual operation thereof.

The test apparatus 100e shown in FIG. 10 can be applied to a DUT 102 which is configured to perform data transmission using a so-called CDR method.

Figure 12:
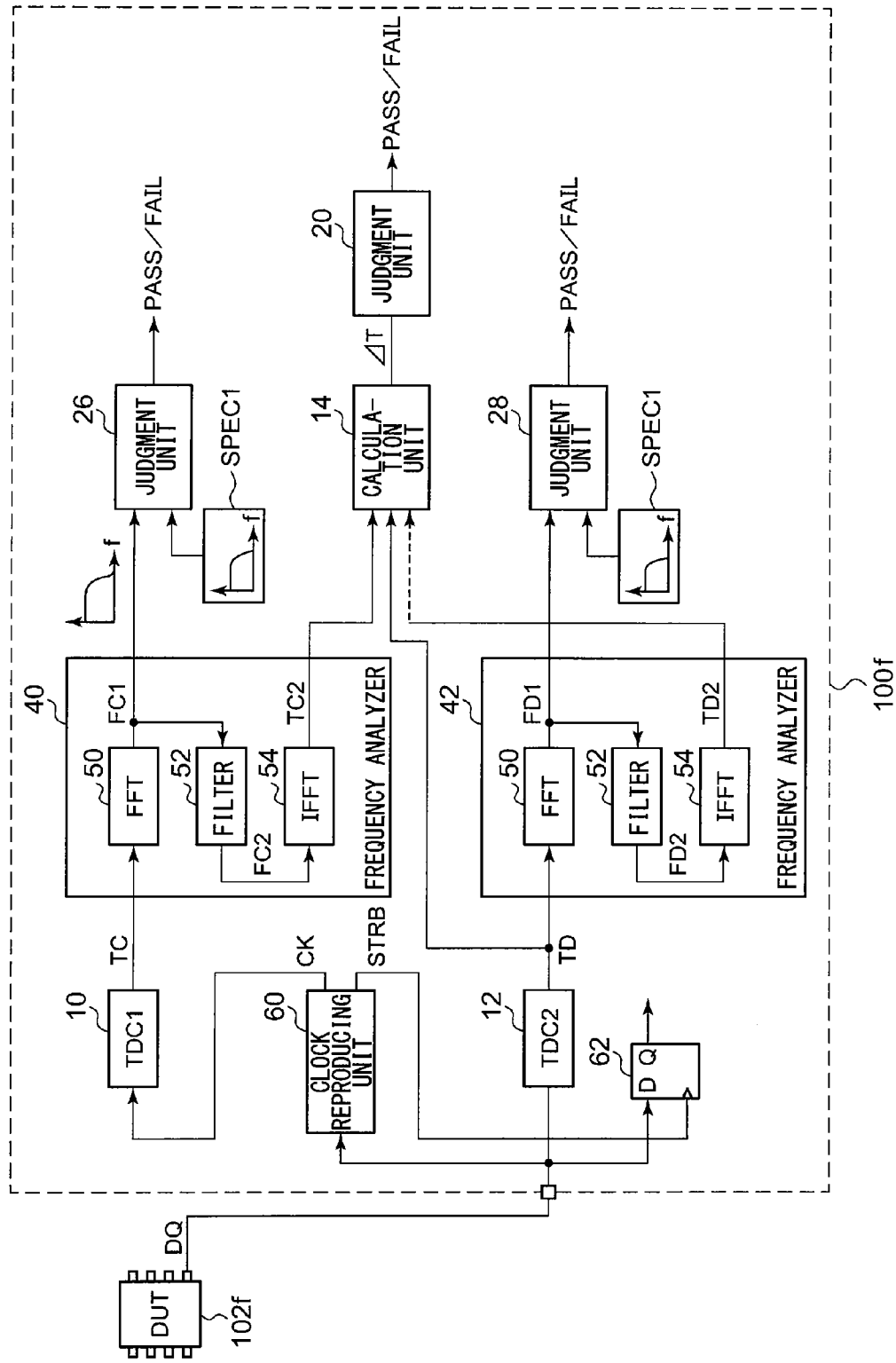
FIG. 12 is a diagram which shows a configuration of a test apparatus configured to test a DUT which performs data transmission using the CDR method.

FIG. 12 is a diagram which shows a configuration of a test apparatus 100f configured to test a DUT 102f configured to perform data transmission using the CDR method.

The DUT 102 embeds a clock signal in a serial data sequence (data signal) DQ by performing the 8B/10B encoding operation or the like. That is to say, the data signal DQ is encoded such that an edge, i.e., a change point is generated every eight cycles (eight phases).

The test apparatus 100f shown in FIG. 12 further includes a clock reproducing unit 60 and a latch 62, in addition to the components of the test apparatus 100e shown in FIG. 10.

The clock reproducing unit 60 decodes the encoded data signal DQ so as to extract the clock signal CK. The clock signal CK thus extracted have an edge every n phases of the data.

Furthermore, the clock reproducing unit 60 generates a strobe signal STRB which is transmitted in synchronization with the clock signal CK thus extracted, and which has a transmission frequency that is n times the frequency of the clock signal CK. For example, the clock reproducing unit 60 is configured using a PLL circuit or a DLL (Delay Locked Loop) circuit. In some cases, the clock reproducing unit 60 is referred to as the "CDR circuit".

The latch 62 latches, at an edge timing of the strobe signal STRB, the data signal DQ received from the DUT 102f. The output signal of the latch 62 is compared with an expected value, for example.

The clock signal CK thus extracted by the clock reproducing unit 60 is input to the first time to digital converter 10. The other steps are the same as those shown in FIG. 10.

The second device, which functions as a communication partner of the DUT 102f in the actual operation, includes a clock reproducing unit and a latch in the same way as with the test apparatus 100f. With such an arrangement, jitter that occurs due to the PLL circuit or the DLL circuit is superimposed on the strobe signal thus generated by the clock reproducing unit. Such jitter occurrence degrades the reception performance of the second device.

The test apparatus 100f shown in FIG. 12 is capable of emulating the effects of the PLL circuit or the DLL circuit of a communication partner device of the DUT 102f. Thus, such an arrangement is capable of judging whether or not the DUT 102f operates normally in the actual operation.

Also, in FIG. 12, in a step where the second clock change point information TC2 is generated, the first frequency analyzer 40 may perform filtering processing on the original time-series data without transforming the data into the frequency domain. In this case, the first frequency analyzer 40 includes a digital filter. The same can be said of the second frequency analyzer 42.

Description has been made regarding the present invention with reference to the embodiments. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

What is claimed is:

1. A test apparatus configured to receive, from a device under test, a clock signal and a data sequence which is transmitted in synchronization with the clock signal and which contains n (n represents an integer of 2 or more) phases of data for each cycle of the clock signal, and to test the device under test, the test apparatus comprising:
    a first time to digital converter configured to receive the clock signal, and to generate clock change point information which represents a change timing of the clock signal;
    a second time to digital converter configured to receive the data sequence in increments of cycles of the clock signal, and to generate data change point information which represents a change timing of the data sequence in increments of phases of the data;
    a first transform unit configured to transform the clock change point information into information with respect to the frequency domain so as to generate first clock change point frequency information;
    a filter having predetermined frequency characteristics, and configured to perform filtering of the first clock change point frequency information so as to generate second clock change point frequency information;
    a second transform unit configured to inverse-transform the second clock change point frequency information into information with respect to the time domain so as to generate second clock change point information;
    a calculation unit configured to calculate difference data between the change timing represented by the data change point information and the change point timing represented by the second clock change point information in increments of phases; and
    a judgment unit configured to evaluate the device under test based upon the difference data received from the calculation unit.

2. A test apparatus configured to receive a data sequence which is output from a device under test using a CDR (Clock Data Recovery) method, and which contains a clock signal embedded every n (n represents an integer of 2 or more) phases, and to test the device under test, the test apparatus comprising:
    a clock reproducing circuit configured to receive the data sequence, to extract the clock signal embedded in the data sequence, and to generate a reproduced clock based upon the clock signal;
    a first time to digital converter configured to receive the reproduced clock, and to generate clock change point information which indicates a change timing of the reproduced clock;
    a second time to digital converter configured to receive the data sequence, and to generate data change point information which indicates a change timing of data in increments of phases;
    a first transform unit configured to transform the clock change point information into information with respect to the frequency domain so as to generate first clock change point frequency information;
    a filter having predetermined frequency characteristics, and configured to perform filtering of the first clock change point frequency information so as to generate second clock change point frequency information;
    a second transform unit configured to inverse-transform the second clock change point frequency information into information with respect to the time domain so as to generate second clock change point information;
    a calculation unit configured to calculate difference data between the change timing represented by the data change point information and the change point timing represented by the second clock change point information in increments of phases; and
    a judgment unit configured to evaluate the device under test based upon the difference data received from the calculation unit.

3. A test method, wherein a clock signal and a data sequence which is transmitted in synchronization with the clock signal, and which contains n (n represents an integer of 2 or more) data phases for each cycle of the clock signal, are received from a device under test, and wherein the device under test is tested, the test method comprising:
    generating clock change point information which represents the change timing of the clock signal;
    generating data change point information which represents the change timing of the data sequence in increments of phases of data;
    transforming the clock change point information into information with respect to the frequency domain so as to generate first clock change point frequency information;
    filtering the first clock change point frequency information with predetermined frequency characteristics so as to generate second clock change point frequency information;
    inverse-transforming the second clock change point frequency information into information with respect to the time domain so as to generate second clock change point information; and
    evaluating the device under test based upon the change timing represented by the data change point information and the change point timing represented by the second clock change point information in increments of phases.

4. A test method wherein a data sequence, which is output from a device under test using a CDR (Clock Data Recovery) method, and which contains a clock signal embedded every n (n represents an integer of 2 or more) phases, is received, and wherein the device under test is tested, the test method comprising:
    extracting the clock signal embedded in the data sequence, and generating a reproduced clock based upon the clock signal;
    receiving the reproduced clock, and generating clock change point information which indicates the change timing of the reproduced clock;
    generating data change point information which indicates the change timing of the data sequence in increments of phases;

transforming the clock change point information into information with respect to the frequency domain so as to generate first clock change point frequency information;

filtering the first clock change point frequency information with predetermined frequency characteristics so as to generate second clock change point frequency information;

inverse-transforming the second clock change point frequency information into information with respect to the time domain so as to generate second clock change point information; and evaluating the device under test based upon the change timing represented by the data change point information and the change point timing represented by the second clock change point information in increments of phases.

* * * * *